OSCILLATOR WITH PUSH-PULL-CONNECTED SEMICONDUCTOR ELEMENTS

Filed Aug. 20, 1968 4 Sheets-Sheet 1

Robert H. Pintell
INVENTOR.

BY

Karl G. Ross
Attorney

INVENTOR:
Robert H. Pintell
BY
Karl G. Ross
Attorney

OSCILLATOR WITH PUSH-PULL-CONNECTED SEMICONDUCTOR ELEMENTS

Filed Aug. 20, 1968 4 Sheets-Sheet 3

BY

Robert H. Pintell
INVENTOR.

Karl F. Ross
Attorney

INVENTOR:
Robert H. Pintell
BY
Karl F. Ross
Attorney

United States Patent Office 3,550,036

Patented Dec. 22, 1970

3,550,036

OSCILLATOR WITH PUSH-PULL-CONNECTED SEMICONDUCTOR ELEMENTS

Robert H. Pintell, Congers, N.Y., assignor to Intron International Inc., Congers, N.Y., a corporation of the United States of America Filed Aug. 20, 1968, Ser. No. 753,989
Int. Cl. H03k *1/16, 3/30*
U.S. Cl. 331—113 15 Claims

ABSTRACT OF THE DISCLOSURE

Two push-pull-connected semiconductor elements, such as transistors or controlled rectifiers, are provided with a predominantly reactive input circuit including a condenser so connected in a feedback path that, upon incipient conduction through one semiconductor element, a charging current flows through the input of that element to drive it to instant saturation. The charging current, decreasing first rapidly and then more gradually from an initial peak, reverses at the instant of switchover to drive the other semiconductor element to its saturated state.

My present invention relates to an oscillator of the type wherein two three-electrode semiconductor elements, such as transistors or controlled rectifiers, are connected in push-pull so as to become alternately conductive to generate a substantially rectangular output current which may be applied directly to a load, with or without rectification (e.g. in accordance with my prior Pat. No. 2,968,-738), or may be converted into a sinusoidal load current (e.g. as disclosed in my prior Pat. No. 3,026,486).

In order to produce the desired square-wave output, such oscillators heretofore made use of saturable transformers with special feedback windings designed to deliver a suitable switching voltage to the inputs of the semiconductor elements. Such saturable transformers are relatively expensive and are also wasteful in operation, owing to the hysteresis losses introduced thereby. When the state of conductivity of the semiconductors is reversed at high load current, considerable switching losses occur in addition.

It is, therefore, the principal object of my present invention to provide an improved oscillator of this general type which avoids the aforestated drawbacks.

Another important object of my invention is to provide an oscillator of the type set forth in which, at the moment of switchover, the semiconductor elements are instantly driven to full saturation and cut off, respectively, even at high operating frequencies so that the resulting output current approximates a purely rectangular wave form.

Particularly when transistors are used as the semiconductor elements, a certain lag is generally encountered between the application of an unblocking voltage to the base/emitter circuit and the appearance of an appreciable flow of collector curent; similarly, the removal of the unblocking voltage is followed only after a certain delay by the complete restoration of the nonconductive state. This phenomenon may be linked to the effect of a virtual capacitance connected across the input electrodes of the transistor, such virtual capacitance being substantially greater than the actual interelectrode capacitance between base and emitter and being due to the finite time required for the injection of a sufficient quantity of minority carriers into the semiconductor and for the subsequent sweep-out of these carriers. Thus, it is a more particular object of my invention to provide an oscillator circuit adapted to generate, at the instant of incipient conduction of one of two paired transistors, a large base curent through this transistor to overdrive the latter for a short fraction of a cycle whereby the necessary population of minority carriers is made available, the base current thereupon decaying rapidly to a sustaining level which maintains the transistor in saturation by supplying enough carriers to compensate for those lost through recombination; conversely, at the end of the half-cycle, the voltage applied to the base is to be abruptly reversed so that the remaining minority carriers are quickly removed and the hitherto conductive transistor is restored to its nonconductive state while its mate goes to saturation, possibly after some controllable delay.

These objects are realized, pursuant to my present invention, by the provision of an input circuit for the two push-pull-connected semiconductor elements which includes one or more condensers in cascade with the control electrode (e.g. base) and one main electrode (e.g. emitter) of each semiconductor element, this input circuit being regeneratively coupled to the common output circuit of the two elements so that these two input electrodes are traversed, upon incipient conduction, by a charging current which instantly drives the element to saturation and which decays first rapidly and then more gradually from an initial peak until a point is reached at which the condenser begins to discharge, thereby firing the other semiconductor element which instantly saturates as the discharge current is stepped up by the feedback into a charging current of opposite polarity with reference to the previous charging current.

With semiconductors whose input circuit loses control over the output current once conduction has been established, as is true of solid-state controlled rectifiers, a commutating condenser or equivalent circuitry may have to be provided to cut off the first semiconductor upon incipient current flow through the second semiconductor; with other types of three-electrode semicondensers, such as the various kinds of transistors, the cutoff occurs automatically as soon as the input current drops below the sustaining level.

The term "connected in cascade," as applied above to the input electrodes and the associated condenser of my improved oscillator, implies that this connection may be direct (the condenser lying in series with these input electrodes) or may include any interposed transformers whereby not the condenser itself but its equivalent capacitance (as reflected from the primary into the secondary circuit) appears in series with the semiconductor input. In either case, I prefer to make the input circuit predominantly reactive so as to minimize the dissipation of feedback energy.

A modulating signal may be impressed upon the input circuit to control the onset of the flow of charging current and/or the time when this current reaches the cutoff level. Such a modulating signal may act upon any suitable variable impedance inserted in the input circuit or in the feedback path, e.g. an auxiliary transistor or a phase shifter; the signal itself may be derived from the oscillator output, for the purpose of stabilizing the operating frequency and/or the mean output energy as generally disclosed in my prior Pat. Nos. 3,088,075 and 3,207,931, or may be externally generated to produce a varying output.

The above and other features of my invention will be described in greater detail with reference to the accompanying drawing in which.

Figure 1:
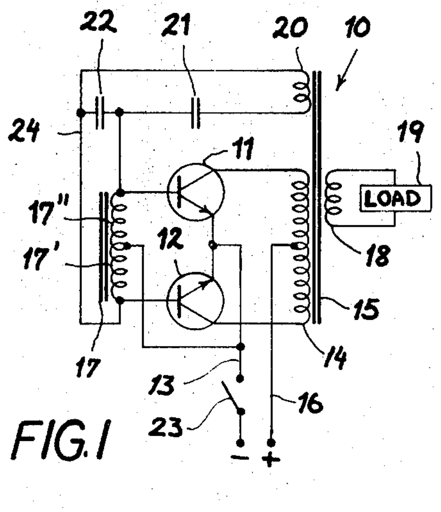
FIGS. 1–11 are circuit diagrams illustrating various oscillators embodying the invention.

In FIG. 1 I have illustrated an oscillator 10 comprising a pair of transistors 11, 12 (here shown to be of the NPN type) with their emitters connected to a negative bus bar 13, their collectors connected across the primary winding 14 of a nonsaturable output transformer 15 whose midpoint is tied to a positive bus bar 16, and with their bases interconnected by a choke 17 having a center tap returned to bus bar 13. Transformer 15 has a main secondary winding 18, connected across a load 19, and a feedback winding 20 connected across choke 17 in series with a capacitor 21. Another condenser 22 is bridged across the choke 17.

A starting switch 23 is shown included in bus bar 13. Upon closure of this switch, negative potential is connected to the emitters of transistors 11, 12 and, via respective halves 17′, 17″ of choke 17, to the bases thereof. The slight voltage drop across these choke halves makes the emitters somewhat more negative than the bases so that the transistors tend to become conductive, one of them generally starting to conduct before the other. The collector current of this one transistor—say, element 11—then traverses the corresponding half of primary winding 14 and induces a feedback voltage in secondary winding 20 which initiates the flow of a charging current through capacitor 21, the base and emitter of transistor 11, bus bar 13 choke portion 17′, and a return lead 24. The polarity of this charging current is such as to block the other transistor 12 and to drive the transistor 11 toward full saturation, with resultant intensification of the charging current which thereby reaches a peak almost immediately upon closure of switch 23. Through proper proportioning of the reactive network 17, 21, 22 I can delay the flow of a substantial part of this charging current through the other half 17″ of choke 17 for a fraction of a cycle sufficient to bring about the saturation of transistor 11; thereafter, the current flow through the input electrodes of this transistor will be reduced as the condenser 21 discharges partly through the base of this transistor and partly through the choke 17. When the magnitude of the base current drops below the conduction-sustaining level, transistor 11 cuts off and the charge built up on condenser 21 causes the flow of a reverse current from that condenser through winding 20, lead 24, base and emitter of transistor 12, bus bar 13 and choke portion 17″; this reverse current is intensified by the inverted feedback voltage now induced in winding 20 as the collector current from transistor 11 disappears. Transistor 12 now begins conducting and generates an oppositely directed current flow in transformer primary 14 so that the feed back voltage increases and gives rise to a reversed charging current which now drives the transistor 12 to saturation. In this second half-cycle the transistor 12 is energized in the same manner as previously transistor 11, a further switchover occurring upon the condenser current dropping to the cutoff level. In this manner, free-running oscillations of a predetermined frequency are generated by the system of FIG. 1; the frequency of these oscillations could be varied, if desired, by a readjustment of any of the reactances 17, 21, and 22. Condenser 22 may be omitted, particularly if it is not desired to vary the tuning of the reactive network to any major extent.

Figure 14:
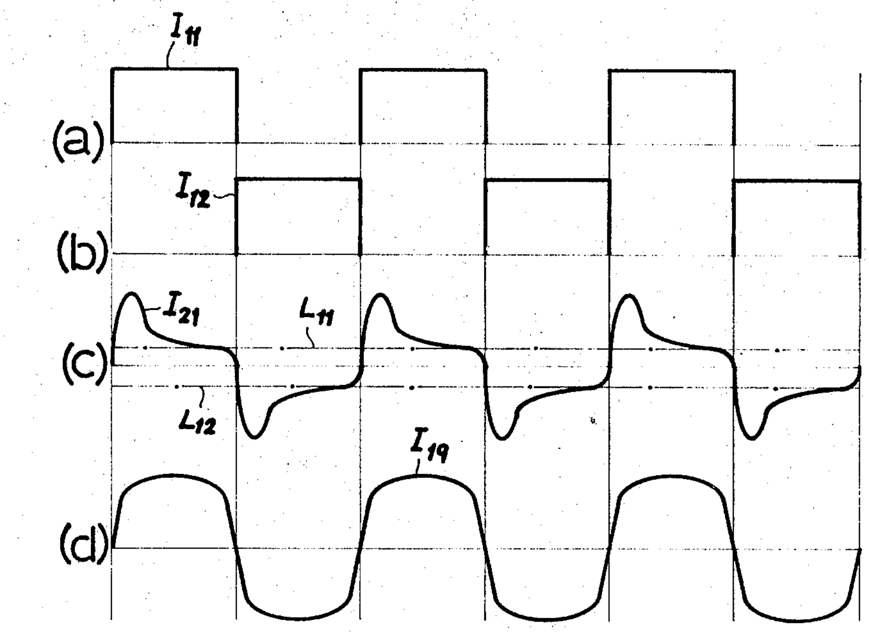
FIGS. 14 and 15 are two sets of explanatory graphs.

The aforedescribed mode of operation of oscillator 10 has been illustrated in FIG. 14 where graphs (*a*) and (*b*) show the collector currents $I_{11}$ and $I_{12}$ of transistors 11 and 12, respectively; graph (*c*) illustrates the charging current $I_{21}$ of capacitor 21 whereas graph (*d*) represents the load current $I_{19}$. It will be noted that the condenser current $I_{21}$ sharply peaks at the instants of switchover, thereafter decaying to the respective cutoff level $L_{11}$ and $L_{12}$; the switchover substantially coincides with the instants of zero load current $I_{19}$ so that switching losses are minimized.

Figure 2:
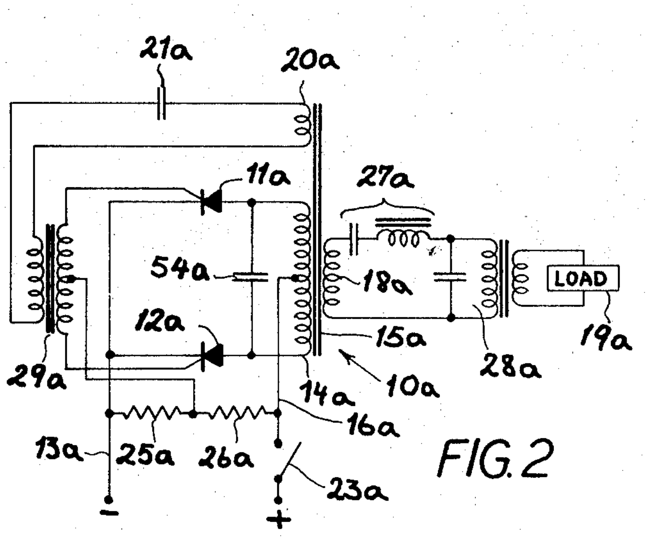

In FIG. 2 I have illustrated an oscillator **10*a* wherein the transistors 11, 12 of FIG. 1 have been replaced by controlled rectifiers 11*a*, 12*a*. The feedback circuit of this oscillator has also been modified in that the winding 20*a* in series with capacitor 21*a* is now connected across the primary of an input transformer 29*a* whose secondary replaces the choke 17 of FIG. 1 and is connected across the gates of the controlled rectifiers. The anodes of rectifiers 11*a*, 12*a* are connected across primary 14*a* of output transformer 15*a* which is bridged by a commutating condenser 54*a*. FIG. 2 also shows the midpoint of the input inductances, i.e. of the secondary of transformer 29*a*, connected not directly to negative bus bar 13*a* but to a point of more positive potential formed by a voltage divider 25*a*, 26*a* which spans the two bus bars 13*a* and 16*a*. Starting switch 23*a* is here shown inserted in the positive bus bar 16*a*. The cathodes of elements 11*a* and 12*a***, like the emitters in the preceding embodiment, are joined together by a conductive connection forming an extension of the negative bus bar.

Finally, FIG. 2 indicates the possibility of energizing the load **19*a* from the secondary 18*a* of output transformer 15*a* with sinusoidal rather than rectangular current by using a combination of series-resonant and parallel-resonant networks 27*a*, 28*a*** as disclosed and claimed in my aforementioned prior Pat. No. 3,026,486.

The operation of oscillator **10*a* is generally similar to that of oscillator 10 in FIG. 1, closure of switch 23*a* resulting in incipient conduction of one of the controlled rectifiers (say, 11*a*) which causes the flow of a charging current for condenser 21*a* through the primary of transformer 29*a* and of a balancing current through the secondary thereof through the input (gate/cathode) circuit of this controlled rectifier via bus bar 13*a*, resistor 25*a* and the center tap of the secondary to drive this semiconductor to saturation. After the charging current has decayed and condenser 21*a* begins to discharge, controlled rectifier 12*a* starts to conduct, the resulting switchover applying an extinction potential to the anode of rectifier 11*a* via commutating condenser 54*a*; the voltage divider 25*a*, 26*a* is so dimensioned that the biasing voltage impressed upon the gates of the controlled rectifiers is barely sufficient to initiate conduction in the absence of a feedback current through condenser 21*a***.

Figure 3:
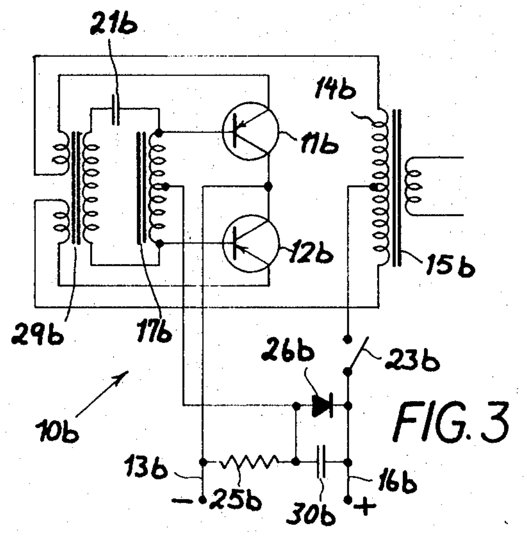

FIG. 3 shows an oscillator **10*b* whose transistors 11*b* and 12*b*, here shown to be of the PNP type, are connected across a center-tapped choke 17*b* bridged by the series combination of condenser 21*b* and the secondary winding of a feedback transformer 29*b* which has two primary windings connected in series with the emitters of transistors 11*b* and 12*b*. FIG. 3 also shows, by way of example, a common-collector circuit wherein the negative bus bar 13*b* is tied to the collectors of both transistors whereas the positive bus bar 16*b* is connected (by way of switch 23*b*) to the midpoint of the primary 14*b* of output transformer 15*b* and thence to the two emitters via the aforementioned primary windings of feedback transformer 29*b*. Bus bars 13*b* and 16*b* are shown bridged by a voltage divider which differs from that of FIG. 2 in that the resistor 26*a* of the preceding embodiment has been replaced by the reverse resistance of a diode 26*b* in series with resistor 25*b*; diode 26*b* is shunted by a condenser 30*b*. With switch 23*b* open, condenser 30*b* charges to the terminal voltage of the D-C source connected across these bus bars so that the bases of transistors 11*b* and 12*b* are driven sharply negative, with reference to their emitters, when the switch 23*b* is closed whereby one transistor is immediately turned on; condenser 30*b* then discharges at a rate determined by the time constant of the network 25*b*, 26*b*, 30*b*, this time constant being advantageously equal to several operating cycles of the oscillator 10*b***.

Figure 4:
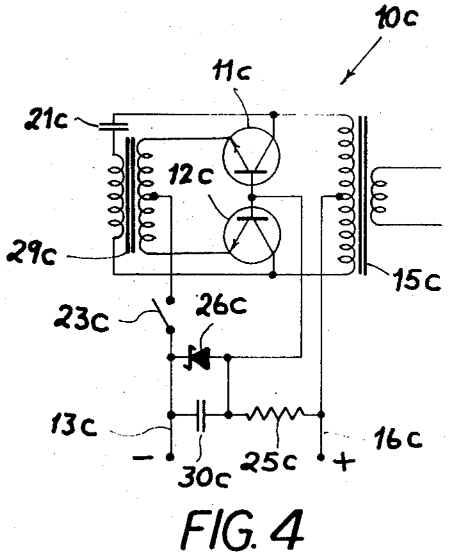

In FIG. 4 I have illustrated another modification wherein an oscillator **10*c* comprises a pair of transistors 11*c*, 12*c* connected across a secondary of a feedback transformer 29*c* in the general manner of the controlled rectifiers 11*a* and 12*a* of FIG. 2. Transistors 11*c* and 12*c*, here of the NPN type, have their bases tied together and connected to a tap on a voltage divider which is generally similar to that of FIG. 3 but wherein the ordinary diode 26*b* has been replaced by a Zener diode 26***c* in series with resistor 25*c* and in parallel with condenser 30*c*. This arrangement reduces the initial charge on the starting condenser 30*c* to a value intermediate the potentials of bus bars 13*c* and 16*c*. Starting switch 23*c* is here shown inserted in bus bar 13*c* which leads to the midpoint of the secondary of feedback transformer 29*c*, the primary of this transformer being connected across the collectors of transistors 11*c* and 12*c* in series with condenser 21*c*. In this embodiment, therefore, the capacitance of the input condenser does not lie directly in series with the input electrodes (emitters) of the two transistors but, as in the circuit arrangement of FIG. 2, is reflected into the input circuit of these semiconductors through the intervening feedback transformer. The output transformer has been shown at 15*c*.

Figure 5:
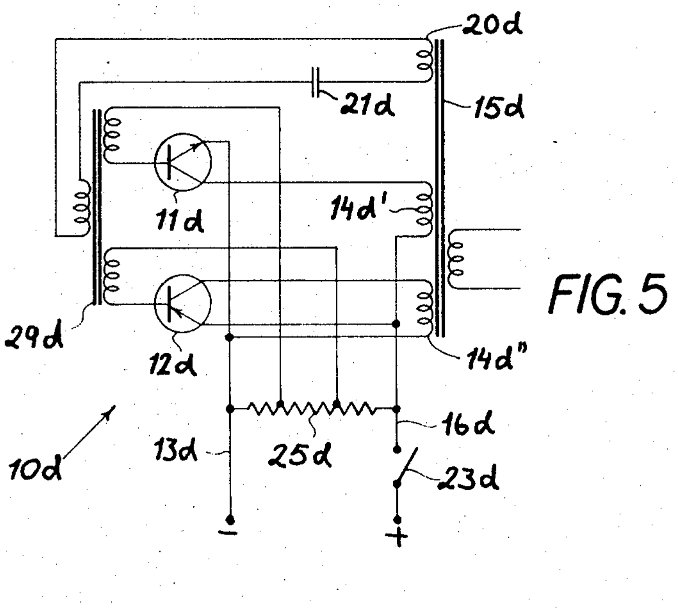

In FIG. 5 I have illustrated the possibility of using two transistors of opposite conductivity types, i.e. an NPN transistor 11*d* and a PNP transistor 12*d*, in an oscillator 10*d* according to the invention. Negative bus bar 13*d* is connected to the emitter of transistor 11*d* and, via a primary winding 14*d''* of output transformer 15*d*, to the collector of transistor 12*d*; positive bus bar 16*d* (which includes the start switch 23*d*) is similarly connected to the emitter of transistor 12*d* and, via another primary winding 14*d'* of transformer 15*d*, to the collector of transistor 11*d*. The input circuit of transistor 11*d* includes a connection from a relatively negative tap on a voltage divider 25*d* to the base of this transistor through a secondary winding of feedback transformer 29*d*; the input circuit of transistor 12*d* includes a connection from a relatively positive tap of voltage divider 25*d* to the base of this transistor through another secondary of transformer 29*d*. The primary of transformer 29*d* is connected, as in the embodiment of FIG. 2, to an auxiliary winding 20*d* of output transformer 15*d* in series with capacitor 21*d*.

Naturally, the secondaries of feedback transformer 29*d* must be so poled that the voltages induced therein, upon a charging of condenser 21*d* in one sense or the other, will render only one of the two transistors conductive.

Figures 6, 9:
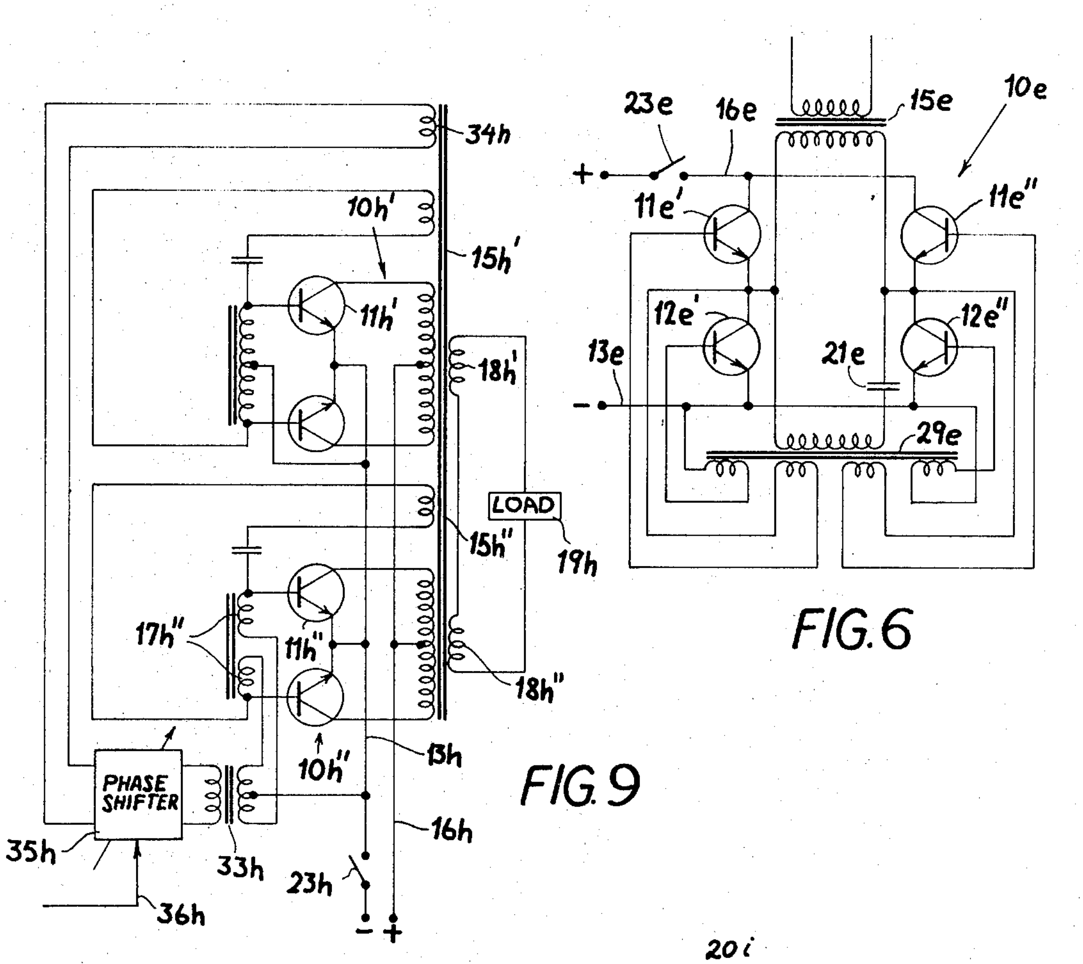

In FIG. 6 I have illustrated an oscillator 10*e* with two pairs of transistors 11*e'*, 12*e'*, 11*e''*, 12*e''* connected in a bridge circuit, the collectors of transistors 11*e'*, 11*e''* being tied to bus bar 16*e* at one corner of the bridge while the emitters of transistors 12*e'*, 12*e''* are tied to bus bar 13*e* at the diagonally opposite corner. Connected in the other diagonal of the bridge are the primary of output transformer 15*e* and, in parallel therewith, the primary of feedback transformer 29*e* lying in series with capacitance 21*e*. Feedback transformer 29*e* has four secondary windings connected across the inputs of the respective transistors. Starting switch 23*e* is shown inserted in bus bar 16*e*.

In the operation of the oscillator 10*e*, condenser 21*e* is alternately charged through the diagonally opposite transistors 11*e'*, 12*e''* and the similarly paired transistors 12*e'*, 11*e''*. The operation is otherwise analogous to that of the circuit of FIG. 4.

Figure 7:
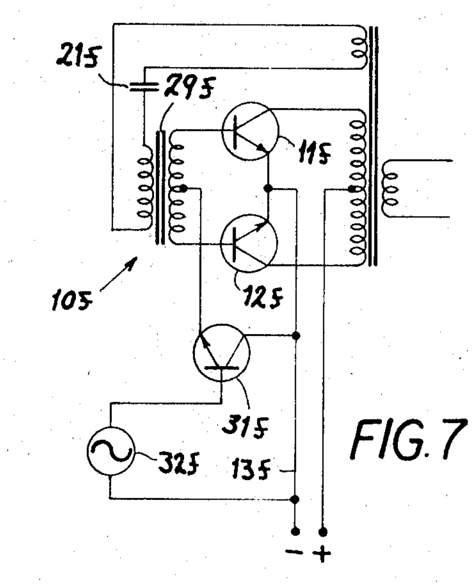

FIG. 7 shows, basically, an oscillator 10*f* which is similar to oscillator 10*c* of FIG. 4 (apart from using a common-emitter connection) and further includes an auxiliary transistor 31*f* inserted in the connection between bus bar 13*f* and the midpoint of the secondary of feedback transformer 29*f*. Trasistor 31*f*, corresponding to a control signal from a source diagrammatically indicated at 32*f*, constitutes a variable impedance in the input circuit of transistors 11*f* and 12*f* which modifies the charging rate of condenser 21*f* represented by the curve $I_{21}$ in graph (*c*) of FIG. 14. This cause the switchover between positive and negative half-cycles to occur at shorter or longer intervals, thereby changing the frequency of the pulse trains $I_{11}$, $I_{12}$ illustrated in graphs (*a*) and (*b*) of FIG. 14. In this embodiment it is not necessary to provide a starting switch since the oscillator may be started and stopped by the application of a suitable biasing voltage to transistor 31*f*.

Figure 8:
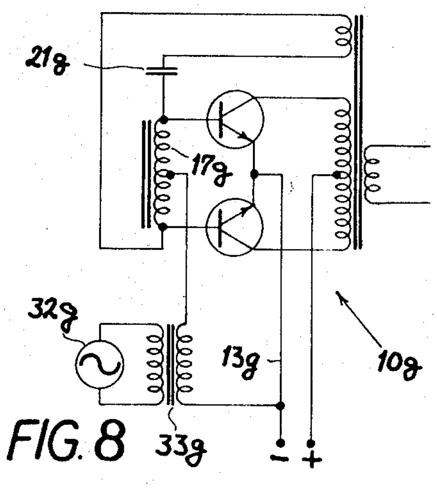

An analogous arrangement has been illustrated in FIG. 8 where the oscillator 10*g*, similar to that of FIG. 1, has an input transformer 33*g* with a primary connected across signal source 32*g* and with a secondary inserted in the connection between bus bar 13*g* and the midpoint of choke 17*g*; control signals applied to transformer 33*g* again serve to modify the charging rate of condenser 21*g*, thereby increasing or reducing the operating frequency of the oscillator.

As illustrated in FIG. 9, I may also control the output of the oscillator by introducing a variable phase shift in the feedback path. Thus, the oscillator shown in FIG. 9 comprises two substantially identical oscillation generators 10*h'* and 10*h''*, both similar to the oscillators 10 and 10*g* of FIGS. 1 and 8, which differ from each other only in that the choke 17*h''* of generator 10*h''* is split into two halves separated by the secondary of a feedback transformer 33*h* whose midpoint is returned to the negative bus bar 13*h*; the primary of transformer 33*h* is connected across a special pick-up winding 34*h* of output transformer 15*h'* of oscillation generator 10*h'*, with interposition of a phase shifter 35*h* having a control input connected to a lead 36*h* for the application of a modulating signal from a source not shown. The secondaries 18*h'* and 18*h''* of the output transformers 15*h'* and 15*h''* of the two oscillation generators are connected in aiding relationship across a load 19*h*. Bus bars 13*h* and 16*h* are common to both transistors, a starting switch 23*h* being included in bus bar 13*h*.

In operation, oscillator 10*h'* functions in the afore-described manner to generate a load current similar to that shown at $I_{19}$ in graph (*d*) of FIG. 14; oscillation generator 10*h''* produces a similar load current whose timing, however, depends on the phase shift, if any, introduced by the circuit 35*h*. Thus, if this phase shift is zero, transistor 11*h''* or 12*h''* of generator 10*h''* will be triggered into conduction substantially concurrently with transistor 11*h'* or 12*h'* of generator 10*h'* by the biasing signal developed across tarnsformer 33*h* so that the output currents in windings 18*h'* and 18h'' will be in in phase. If, however, a finite phase shift is introduced by the control circuit 35*h*, the two oscillation generators 10*h'* and 10*h''* will operate in the same rhythm but with staggered periods so that the magnitude of the combined load current with decrease; with a phase shift of 180°, this load current disappears completely. If the coils 18*h'* and 18*h''* were connected in series-opposing relationship, the load current would be zero in the absence of a phase shift and would progressively increase with the angle of shift of phase shifter 35*h*.

Figure 10:
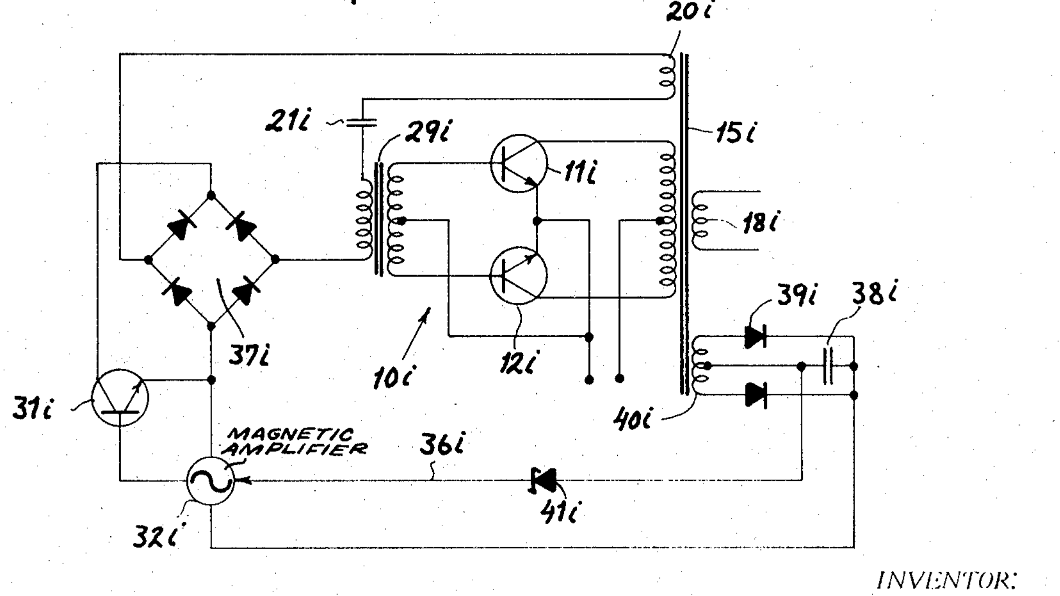

FIG. 10 shows an oscillator 10*i*, similar to that of FIG. 7, whose control circuit includes an auxiliary transistor 31*i* in series with the output diagonal of a rectifier bridge 37*i* whose input diagonal lies in series with the primary of feedback transformer 29*i* as well as feedback winding 20*i* and condenser 21*i*. An input signal from a source 32*i* applied to transistor 31*i* will therefore create a bias to alter the operation of the oscillator in essentially the manner described in connection with FIG. 7.

The signal source 32*i* could be controlled by the oscillator output in a manner tending to stabilize the average load current. Thus, with the aid of suitable circuitry as described, for example, in my prior Pat. Nos. 3,088,075 and 3,207,931, I may derive from the load current $I_{19}$ (FIG. 14) a train of rectangular pulses whose width varies in accordance with the charge of an ancillary condenser 38*i* which is connected via a rectifier network 39*i* across another secondary 40*i* of output transformer 15*i*; the source 32*i* may in this case include a magnetic amplifier controlled, as in my aforementioned prior patents, through a lead 36*i* which may include a Zener diode 41*i*.

Figure 15:
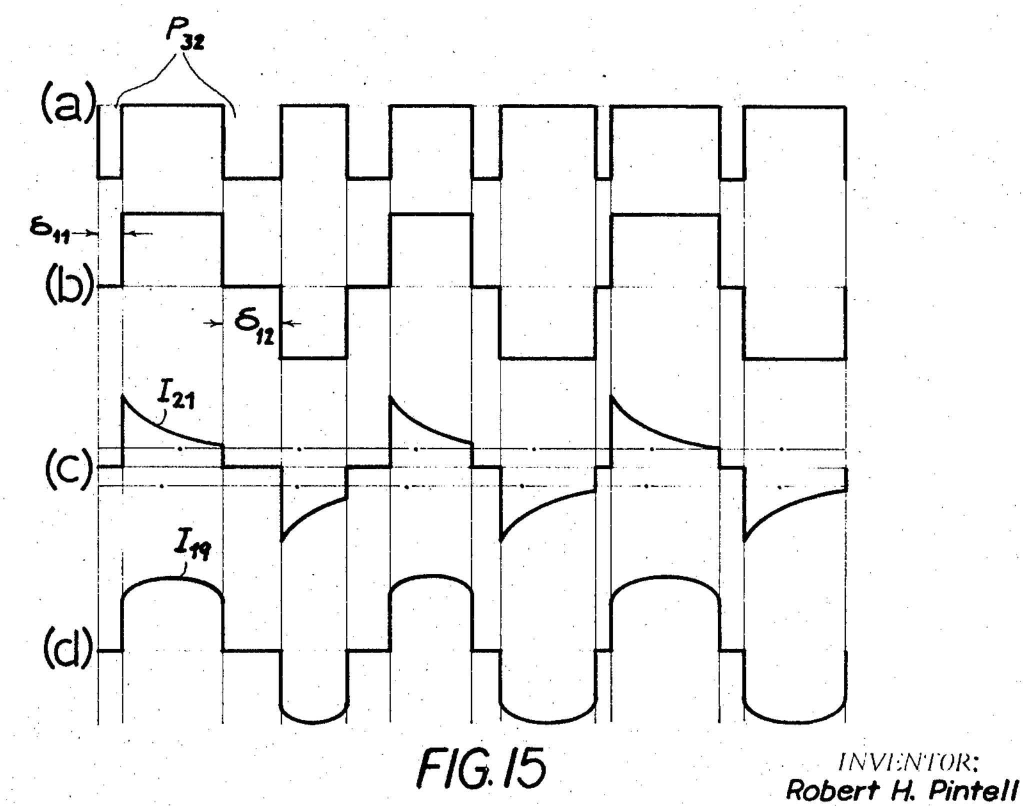

Reference will now be made to FIG. 15 for an explanation of the manner in which rectangular pulses generated by the source 32*i*, in response to the charge on condenser 38*i* and therefore to the magnitude of the load current in output winding 18*i*, stabilizes this magnitude by introducing a compensatory bias into the feedback circuit of oscillator 10*i*. As shown in graph (*a*) of FIG. 15, the control pulses $P_{32}$ are of varying width, it being assumed that this width is substantially proportional to the charge on condenser 38*i*. Since these pulses are of negative polarity so as to block the transistor 31*i*, they interrupt the charging circuit of condenser 21*i* for longer or shorter periods at the beginning of each half-cycle, i.e. upon switchover from transistor 11*i* to transistor 12*i* or vice versa. These transistors are therefore triggered into saturation after varying delays $\delta$11, $\delta$12, following cutoff of the respective companion transistor, as illustrated in graph (*b*) of FIG. 15. The dalayed turn-on of these transistors therefore shortens the time interval available for the flow of charging current $I_{21}$, graph (*c*), this interval being terminated by the occurrence of the next blocking pulse $P_{32}$ which cuts off the conductive transistor and preserves the charge on condenser 21*i* until the pulse disappears whereupon the condenser begins to discharge and to acquire a reverse charge as previously described. The result is a load current $I_{19}$ which, as shown in graph (*d*) of FIG. 15, has a generally rectangular wave shape with pulses of varying width. The substantial constancy of the fundamental frequency of wave $I_{19}$ may be insured by the use of a resonant load circuit as illustrated in FIG. 2 and described in my prior Pat. No. 3,026,486.

The control pulses applied to transistor 31*i* need not occur at the beginning of each half-cycle but may be supplied in a more or less random manner from an extraneous source. Conversely, a synchronizing circuit as shown at 36*i* in FIG. 10 could also be used to control the signal sources 32*f*, 32*g* of FIGS. 7 and 8 or the phase shifter 35*h* of FIG. 9.

Figure 11:
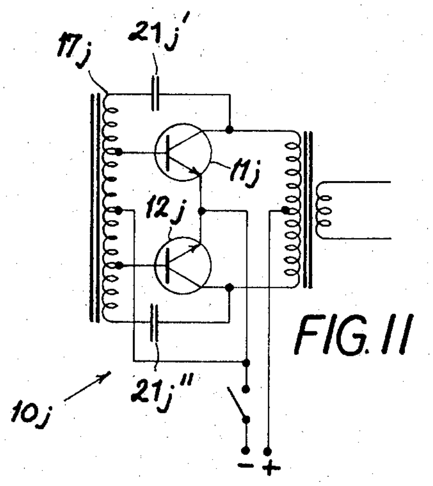

FIG. 11 shows an oscillator 10*j* whose choke 17*j* is designed as an autotransformer which steps down the switching potential applied to the bases of transistors 11*j*, 12*j*, the collectors of these transistors being connected across the extremities of the autotransformer 17*j* through respective capacitors 21*j*' and 21*j*''. The system operates otherwise in the manner of oscillator 10 of FIG. 1.

Figure 12:
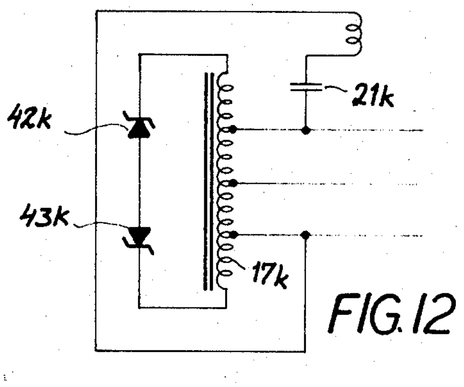
FIGS. 12 and 13 show modified input circuits to be used with some of the oscillators of the preceding figures.
Figure 13:
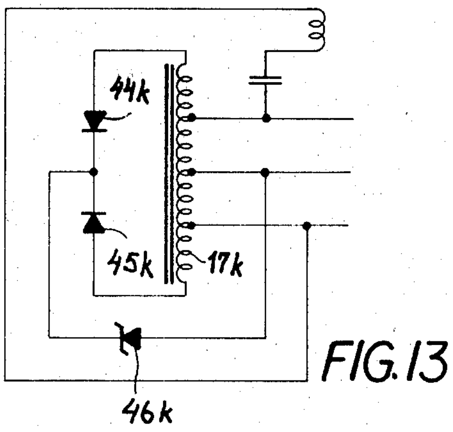

FIG. 12 shows a choke 17*k* which operates as a step-up autotransformer winding whose terminal voltage is impressed upon a pair of Zener (i.e. avalanche-type) diodes 42*k*, 43*k* connected back-to-back across the extremities of that winding; the input circuit of the transistors in series with condenser 21*k* (cf. FIG. 1) is connected across an intermediate portion of the choke by way of intermediate taps thereof. Zener diodes 42*k* and 43*k* serve to limit the charging current of the condenser flowing into the bases of the associated transistors, thereby flattening the peaks of current $I_{21}$ shown in graph (*c*) of FIG. 14. A similar effect is obtained by the circuit arrangement of FIG. 13 in which choke 17*k* is connected across two oppositely poled diodes 44*k*, 45*k* whose junction is returned to the midpoint of the choke through a single Zener diode 46*k*.

The system of my invention allows the use of low-cost linear transformers and eliminates power losses due to saturation. With the collector current and the collector voltage of the transistors lying generally in phase, switching losses are also minimal. No voltage spikes occur in the transistors so that no allowance need to be made for transients, the transistors being therefore operable at maximum rated collector current and emitter/collector voltage. Under no-load conditions, current flow will be very low since no saturation energy needs to be supplied; this yields very high conversion efficiencies at light loads.

Naturally, within the limits of compatibility, the several oscillators shown in different figures may be modified in light of one another, as by replacing NPN transistors by PNP transistors and vice versa, by the use of other semiconductor elements such as controlled rectifiers, and by interchangeably using grounded collectors, emitters or bases. These and other modifications readily apparent to persons skilled in the art are intended to be embraced within the spirit and scope of my invention as defined in the appended claims.

I claim:

1. An oscillator comprising two semiconductor elements each having a first main electrode and two input electrodes including a second main electrode and a control electrode, said second main electrodes being joined together by a conductive connection; a load circuit including an output transformer with a primary winding connected across said first main electrodes and a source of direct current inserted between said conductive connection and the midpoint of said primary winding; an input circuit with two parallel branches extending from said conductive connection to said control electrodes; a pair of inductances serially connected in said branches; a feedback circuit including a secondary winding of said output transformer and capacitive means in series with said secondary winding, said feedback circuit being connected across said inductances for generating therein an alternating current flow in the rhythm of a similar current induced in said secondary winding upon alternate conduction of said elements whereby the latter are alternately driven to saturation and cutoff; and controllable impedance means in said input circuit for modifying said alternating current flow.

2. An oscillator as defined in claim 1 wherein said controllable impedance means forms part of a stabilizing network including a further secondary winding of said output transformer.

3. An oscillator as defined in claim 2 wherein said controllable impedance means comprises a transistor, said stabilizing network including a source of control signals for said impedance means energized from said further secondary winding.

4. An oscillator as defined in claim 3 wherein said source of control signals comprises a magnetic amplifier.

5. An oscillator as defined in claim 3 wherein said inductances form part of a secondary winding of an input transformer having a primary winding and a rectifier bridge in series with said capacitive means, said controllable impedance means being inserted in an output diagonal of said rectifier bridge.

6. An oscillator as defined in claim 1 wherein said controllable impedance means is inserted between said conductive connection and a common terminal of said inductances.

7. An oscillator as defined in claim 6 wherein said controllable impedance means comprises a transistor.

8. An oscillator as defined in claim 6 wherein said controllable impedance means comprises a transformer energized from a source of A-C signals.

9. An oscillator as defined in claim 1 wherein said controllable impedance means is connected between said inductances.

10. An oscillator as defined in claim 9 wherein said controllable impedance means comprises an adjustable phase shifter.

11. An oscillator comprising two semiconductor elements each having a first main electrode and two input electrodes including a second main electrode and a control electrode, said second main electrodes being joined together by a conductive connection; a load circuit including an output transformer with a primary winding connected across said first main electrodes and a source of direct current inserted between said conductive connection and the midpoint of said primary winding; an input circuit with two parallel branches extending from said conductive connection to said control electrodes; a pair of inductances serially connected in said branches; a feedback circuit including a secondary winding of said output transformer and capacitive means in series with said secondary winding, said feedback circuit being connected across said inductances for generating therein an alternating current flow in the rhythm of a similar current induced in said secondary winding upon alternate conduction of said elements whereby the latter are alternately driven to saturation and cutoff; and a current-limiting circuit connected across the input electrodes of said elements in shunt with said inductances.

12. An oscillator as defined in claim 11 wherein said current-limiting circuit includes avalanche-type diode means connected to break down in response to a predetermined voltage drop across said inductances.

13. An oscillator as defined in claim 12 wherein said inductances are part of an autotransformer winding with intermediate taps connected across the series combination of said secondary winding and said capacitive means, said current-limiting circuit including sections of said autotransformer wnding lying between the extremities thereof and said taps.

14. An oscillator as defined in claim 13 wherein said avalanche-type diode means comprises a pair of Zener diodes connected back-to-back across said extremities.

15. An oscillator as defined in claim 13 wherein said current-limiting circuit further includes a pair of rectifying diodes connected back-to-back across said extremities, said avalanche-type diode means being connected between the junction of said rectifying diodes and the midpoint of said autotransformer winding.

References Cited

UNITED STATES PATENTS

| | | | |
|---|---|---|---|
| 3,256,495 | 6/1966 | Hunter | 331—113(.1) |
| 3,268,833 | 8/1966 | Miller et al. | 331—113(.1) |

FOREIGN PATENTS

| | | | |
|---|---|---|---|
| 1,073,617 | 1/1960 | Germany | 331—113(.1) |

ROY LAKE, Primary Examiner

S. H. GRIMM, Assistant Examiner

U.S. Cl. X.R.

331—175